United States Patent
Iwasaki

(10) Patent No.: US 6,999,734 B2
(45) Date of Patent: Feb. 14, 2006

(54) NONLINEAR COMPENSATING CIRCUIT, BASE-STATION APPARATUS, AND TRANSMISSION POWER CLIPPING METHOD

(75) Inventor: Motoya Iwasaki, Tokyo (JP)

(73) Assignee: NEC Corporation, Tokyo (JP)

( * ) Notice: Subject to any disclaimer, the term of this patent is extended or adjusted under 35 U.S.C. 154(b) by 560 days.

(21) Appl. No.: 10/304,850

(22) Filed: Nov. 27, 2002

(65) Prior Publication Data

US 2003/0104793 A1    Jun. 5, 2003

(30) Foreign Application Priority Data

Dec. 5, 2001   (JP) ............................. 2001-371717

(51) Int. Cl.
*H04B 1/04*   (2006.01)
(52) U.S. Cl. ............... 455/114.3; 455/103; 375/297
(58) Field of Classification Search ............ 455/114.2, 455/114.3, 126, 127.2, 127.3, 103; 375/296, 375/297; 330/295, 149
See application file for complete search history.

(56) References Cited

U.S. PATENT DOCUMENTS 5,327,096 A * 7/1994 Sakamoto et al. .......... 330/151
6,434,135 B1 * 8/2002 Ozluturk et al. ............. 370/342
6,861,904 B2 * 3/2005 Ishigami et al. ............. 330/151

FOREIGN PATENT DOCUMENTS

| JP | 7-321861 | 12/1995 |
|----|----------|---------|
| JP | 11-88257 | 3/1999 |
| JP | 11-313042 | 11/1999 |
| JP | 2000-332723 | 11/2000 |
| JP | 2001-77708 | 3/2001 |
| JP | 2001-168741 | 6/2001 |

* cited by examiner

*Primary Examiner*—Nguyen T. Vo
(74) *Attorney, Agent, or Firm*—Young & Thompson

(57) ABSTRACT

A nonlinear compensating circuit, a base-station apparatus and a transmission power clipping method for executing a clipping operation in a high output amplifier at the transmitting end during multicarrier amplification. A plurality of power converting circuits calculate power values of respective input signals. An adder adds up the calculated power values to obtain a synthetic power value P. A divider divides a predetermined threshold value T by the synthetic power value P. When the divided value T/P is equal to or more than 1, a determining circuit outputs a clip control signal for turning off the clipping operation to a plurality of clipping circuits. When the divided value T/P is less than 1, the clip control signal turn on the clipping operation.

17 Claims, 9 Drawing Sheets

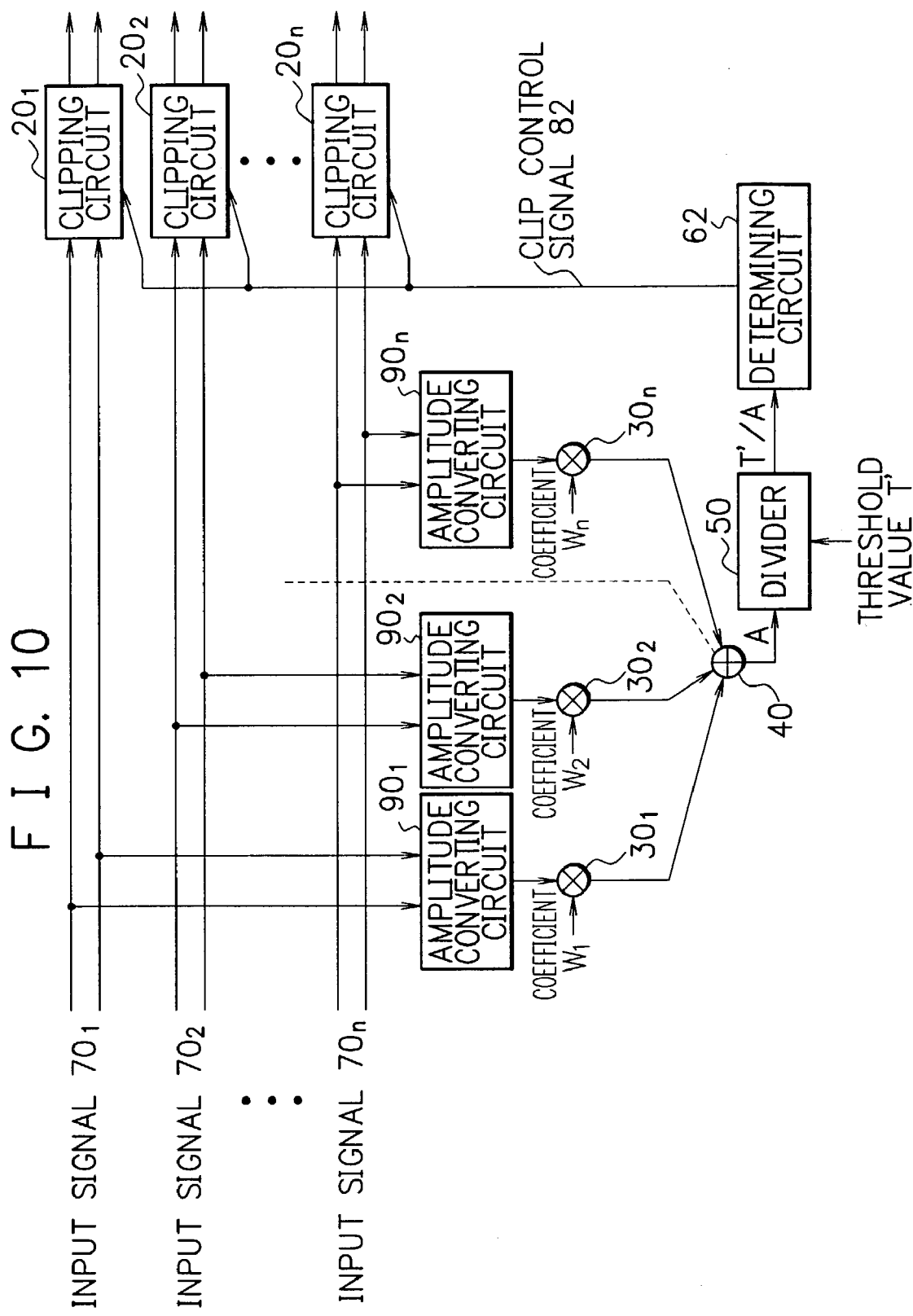

NONLINEAR COMPENSATING CIRCUIT, BASE-STATION APPARATUS, AND TRANSMISSION POWER CLIPPING METHOD

BACKGROUND OF THE INVENTION

The present invention relates to a nonlinear compensating circuit, a base-station apparatus and a transmission electric power clipping method for reducing a ratio of instantaneous power to average power by intentionally clipping the amplitude of signals before baseband filters to thereby lower an upper-limit level of linearity required of an amplifier.

DESCRIPTION OF THE RELATED ART

In the recent digital mobile communication, the CDMA communication method has come into wide use to improve anti-interference capability.

In the CDMA communication method, since instantaneous power becomes higher by the side of average power, there arises a need to keep linearity of a transmitting high output power amplifier up to an extremely high power level to prevent a transmission spectrum from spreading and the power from leaking into an adjacent channel. Thereby, the configuration of the amplifier becomes large and its cost becomes high, accordingly leading to high power consumption.

To solve the problem, there employed a method of intentionally clipping the amplitude of signals before baseband filters to lower the ratio of the instantaneous power to the average power and to keep down the upper-limit level of the linearity required for the amplifier. By this means, it is possible to prevent the transmission spectrum from spreading even with an amplifier having poor linearity. In this case, characteristics of modulation accuracy in a transmitter are deteriorated. However, by designing the system so as to tolerate the deterioration, the cost of the system can be reduced. FIG. 1 shows a conventional nonlinear compensating circuit having such configuration. The conventional nonlinear compensating circuit comprises a power converting circuit 110, a determining circuit 160, and a clipping circuit 120.

The power converting circuit 110 calculates a power value of an input signal 70 and outputs the power value to the determining circuit 160. The determining circuit 160 compares the power value calculated by the power converting circuit 110 with a predetermined threshold value. When the power value is equal to or more than the threshold value, the determining circuit 160 outputs a clip control signal for turning on a clipping operation to the clipping circuit 120.

In this case, the clipping circuit 120 converts the input signal 70 so that the amplitude thereof becomes equal to the threshold value while the phase thereof is kept unchanged. On the other hand, when the power value is less than the threshold value, the determining circuit 160 outputs a clip control signal for turning off the clipping operation thereto. In this case, the clipping circuit 120 outputs the input signal 70 as it is.

According to such conventional nonlinear compensating circuit, the clipping operation is performed such that the amplitude of the input signal 70 is always less than or equal to the threshold value, namely, the amplitude thereof never exceeds the threshold value.

FIG. 2 is a block diagram showing the configuration of this circuit when used for multicarrier amplification to amplify signals in a plurality of frequencies with one amplifier. However, the circuit is not sufficiently effective in this configuration because the influence of the nonlinearity of the high output amplifier cannot be fully averted. To be concrete, while the clipping is executed before baseband filters, that is, the clipping is executed with respect to each carrier, the effect of the clipping is lost because the signals are synthesized in terms of vector after multicarrier multiplexing.

For example, it is assumed that a signal in the respective carriers has an average power of 0 dB and a signal having instantaneous power of 6 dB or more is clipped with respect to each carrier as shown in FIG. 3. When two carriers (signals) are synthesized, the average power of the synthesized signals becomes 3 dB. In this case, however, the synthesized instantaneous power at the clipped point becomes 12 dB at the maximum because of vector synthesis. This means that the instantaneous power is higher than the synthesized average power by 9 dB. Accordingly, the effect of the clipping is reduced.

Namely, in the conventional nonlinear compensating circuit described above, the clipping is executed with respect to each carrier and thereafter the carriers are multiplexed. Thereby, the above-described conventional nonlinear compensating circuit cannot achieve sufficient effects under the multicarrier amplifying method.

SUMMARY OF THE INVENTION

It is therefore an object of the present invention to provide a nonlinear compensating circuit and a transmission power clipping method for executing a clipping operation, which is beneficial against nonlinear characteristics of a high output amplifier at a transmitting end, even in the case of multicarrier amplification. According to an aspect of the present invention, for achieving the object mentioned above, there is provided a nonlinear compensating circuit for compensating nonlinearity of an amplifying means on the occasion of transmission after performing frequency conversion of a plurality of input signals to obtain signals of different frequencies, synthesizing the signals, and amplifying the synthesized signals by the amplifying means, comprising:

a plurality of power converting means for calculating power values of the respective input signals;

an adding means for calculating a synthetic power value by adding up the power values calculated by the plural power converting means;

a determining means for determining whether or not the synthetic power value is more than a predetermined threshold value, and outputting a clip control signal for turning off a clipping operation when the calculated synthetic power value is less than or equal to the threshold value, or outputting a clip control signal for turning on a clipping operation, which includes a coefficient to make the synthetic power value of the plural input signals less than or equal to the threshold value, when the calculated synthetic power value is more than the threshold value; and a plurality of clipping means for performing clipping on/off operation according to the clip control signal obtained from the determining means, which directly output the plural input signals when inputting therein the clip control signal for turning off the clipping operation, or multiply the plural input signals by the coefficient to output the resultant values when inputting therein the clip control signal for turning on the clipping operation.

According to another aspect of the present invention, there is provided a nonlinear compensating circuit for compensating nonlinearity of an amplifying means on the occasion of transmission after performing frequency conversion of a plurality of input signals to obtain signals of different frequencies, synthesizing the signals, and amplifying the synthesized signals by the amplifying means, comprising:

a plurality of power converting means for calculating power values of the respective input signals;

an adding means for calculating a synthetic power value P by adding up the power values calculated by the plural power converting means;

a dividing means for carrying out an operation of dividing a predetermined threshold value T by the synthetic power value P to output the operation result as a divided value T/P;

a determining means for outputting a clip control signal for turning off a clipping operation when the divided value T/P obtained from the dividing means is equal to or more than 1, or outputting a clip control signal for turning on a clipping operation, which includes a square root of the divided value, $(T/P)^{1/2}$, when the divided value T/P is less than 1; and a plurality of clipping means for performing clipping on/off operation according to the clip control signal obtained from the determining means, which directly output the plural input signals when inputting therein the clip control signal for turning off the clipping operation, or multiply the plural input signals by the square root of the divided value, $(T/P)^{1/2}$, to output the resultant values when inputting therein the clip control signal for turning on the clipping operation.

According to the present invention, since the clipping operation is performed on the basis of the total power of the respective carriers, the total power being more approximate to the power (power value) that is obtained after the multicarrier synthesis, the synthesized power can be more effectively clipped, thus preventing the transmission spectrum from spreading.

According to yet another aspect of the present invention, there is provided a nonlinear compensating circuit for compensating nonlinearity of an amplifying means on the occasion of transmission after performing frequency conversion of a plurality of input signals to obtain signals of different frequencies, synthesizing the signals, and amplifying the synthesized signals by the amplifying means, comprising:

a plurality of power converting means for calculating power values of the respective input signals;

a plurality of multiplying means for multiplying the plural power values calculated by the plural power converting means by predetermined coefficients, respectively, to output the resultant values;

an adding means for calculating a synthetic power value P by adding up the outputs from the multiplying means;

a dividing means for carrying out an operation of dividing a predetermined threshold value T by the synthetic power value P to output the operation result as a divided value T/P;

a determining means for outputting a clip control signal for turning off a clipping operation when the divided value T/P obtained from the dividing means is equal to or more than 1, or outputting a clip control signal for turning on a clipping operation, which includes a square root of the divided value, $(T/P)^{1/2}$, when the divided value T/P is less than 1; and a plurality of clipping means for performing clipping on/off operation according to the clip control signal obtained from the determining means, which directly output the plural input signals when inputting therein the clip control signal for turning off the clipping operation, or multiply the plural input signals by the square root of the divided value, $(T/P)^{1/2}$, to output the resultant values when inputting therein the clip control signal for turning on the clipping operation.

According to the present invention, the plural power values calculated by the power converting means are multiplied by the predetermined coefficients, respectively, before synthesized. Thereby, when there exists the variation in the amplification characteristics of the amplifying means depending on frequency, an ideal clipping operation can be executed by multiplying each power value by a weighting factor with respect to each carrier on the occasion of calculating the synthetic power of the multicarrier to absorb the variation.

According to another aspect of the present invention, there is provided a nonlinear compensating circuit for compensating nonlinearity of an amplifying means on the occasion of transmission after performing frequency conversion of a plurality of input signals to obtain signals of different frequencies, synthesizing the signals, and amplifying the synthesized signals by the amplifying means, comprising:

a plurality of amplitude converting means for calculating amplitude values of the respective input signals;

an adding means for calculating a synthetic amplitude value A by adding up the amplitude values calculated by the plural amplitude converting means;

a dividing means for carrying out an operation of dividing a predetermined threshold value T' by the synthetic amplitude value A to output the operation result as a divided value T'/A;

a determining means for outputting a clip control signal for turning off a clipping operation when the divided value T'/A obtained from the dividing means is equal to or more than 1, or outputting a clip control signal for turning on a clipping operation, which includes the divided value T'/A, when the divided value T'/A is less than 1; and a plurality of clipping means for performing clipping on/off operation according to the clip control signal obtained from the determining means, which directly output the plural input signals when inputting therein the clip control signal for turning off the clipping operation, or multiply the plural input signals by the divided value T'/A to output the resultant values when inputting therein the clip control signal for turning on the clipping operation.

According to a further aspect of the present invention, there is provided a nonlinear compensating circuit for compensating nonlinearity of an amplifying means on the occasion of transmission after performing frequency conversion of a plurality of input signals to obtain signals of different frequencies, synthesizing the signals, and amplifying the synthesized signals by the amplifying means, comprising:

a plurality of amplitude converting means for calculating amplitude values of the respective input signals;

a plurality of multiplying means for multiplying the plural amplitude values calculated by the plural amplitude converting means by predetermined coefficients, respectively, to output the resultant values;

an adding means for calculating a synthetic amplitude value A by adding up the outputs from the multiplying means;

a dividing means for carrying out an operation of dividing a predetermined threshold value T' by the synthetic amplitude value A to output the operation result as a divided value T'/A;

a determining means for outputting a clip control signal for turning off a clipping operation when the divided value T'/A obtained from the dividing means is equal to or more than 1, or outputting a clip control signal for turning on a clipping operation, which includes the divided value T'/A, when the divided value T'/A is less than 1; and a plurality of clipping means for performing clipping on/off operation according to the clip control signal obtained from the determining means, which directly output the plural input signals when inputting therein the clip control signal for turning off the clipping operation, or multiply the plural input signals by the divided value T'/A to output the resultant values when inputting therein the clip control signal for turning on the clipping operation.

BRIEF DESCRIPTION OF THE DRAWINGS

The objects and features of the present invention will become more apparent from the consideration of the following detailed description taken in conjunction with the accompanying drawings in which:

FIG. 10 is a block diagram showing a configuration of a nonlinear compensating circuit according to a third embodiment of the present invention.

DESCRIPTION OF THE PREFERRED EMBODIMENTS

Figure 1:
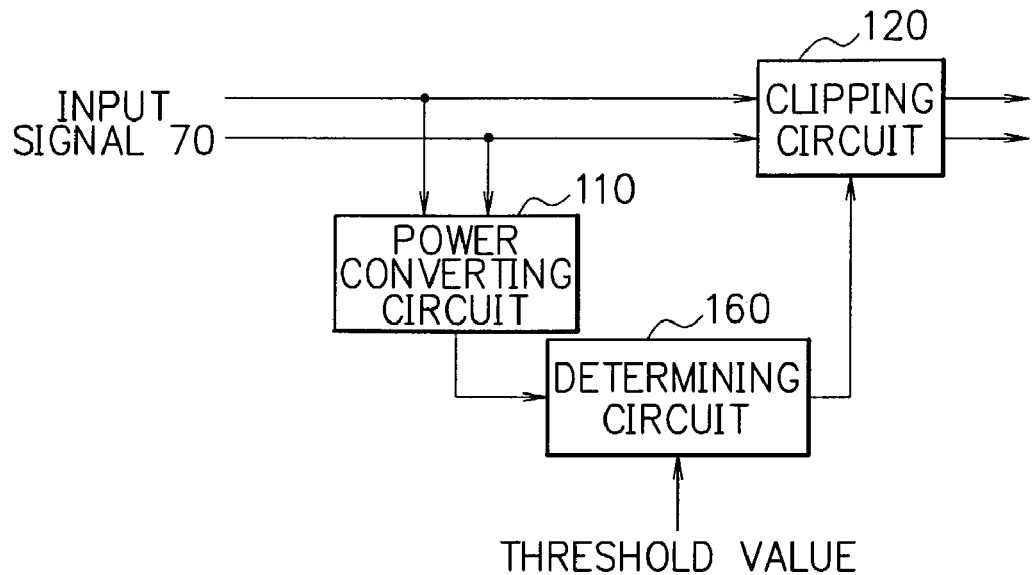
FIG. 1 is a block diagram showing a configuration of a conventional nonlinear compensating circuit.
Figure 2:
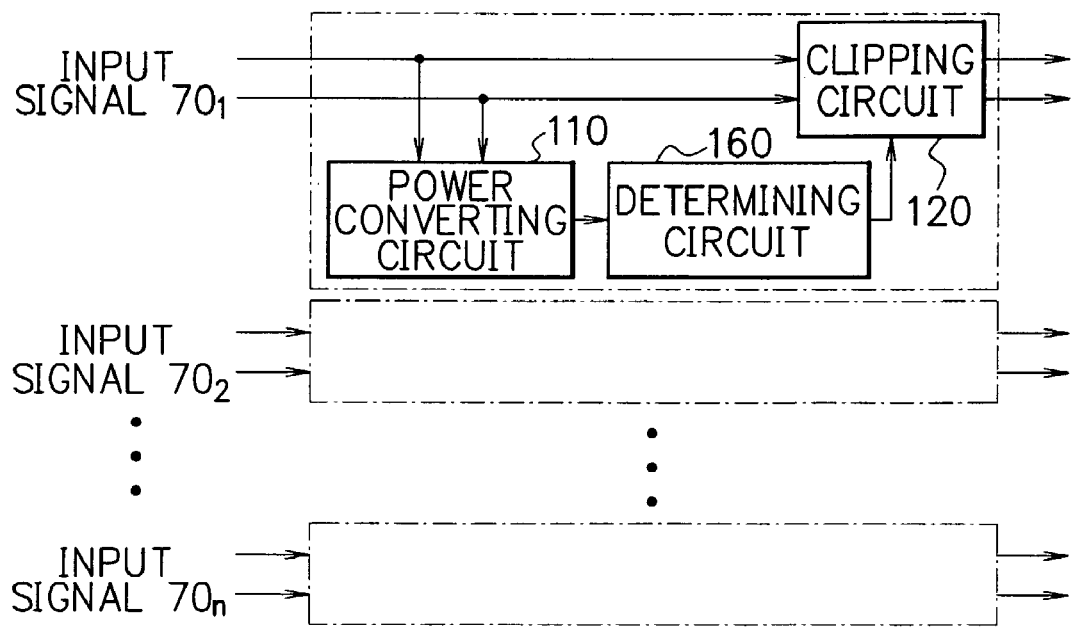
FIG. 2 is a block diagram showing a case of applying the conventional nonlinear compensating circuit to a multicarrier amplifying method.
Figure 3:
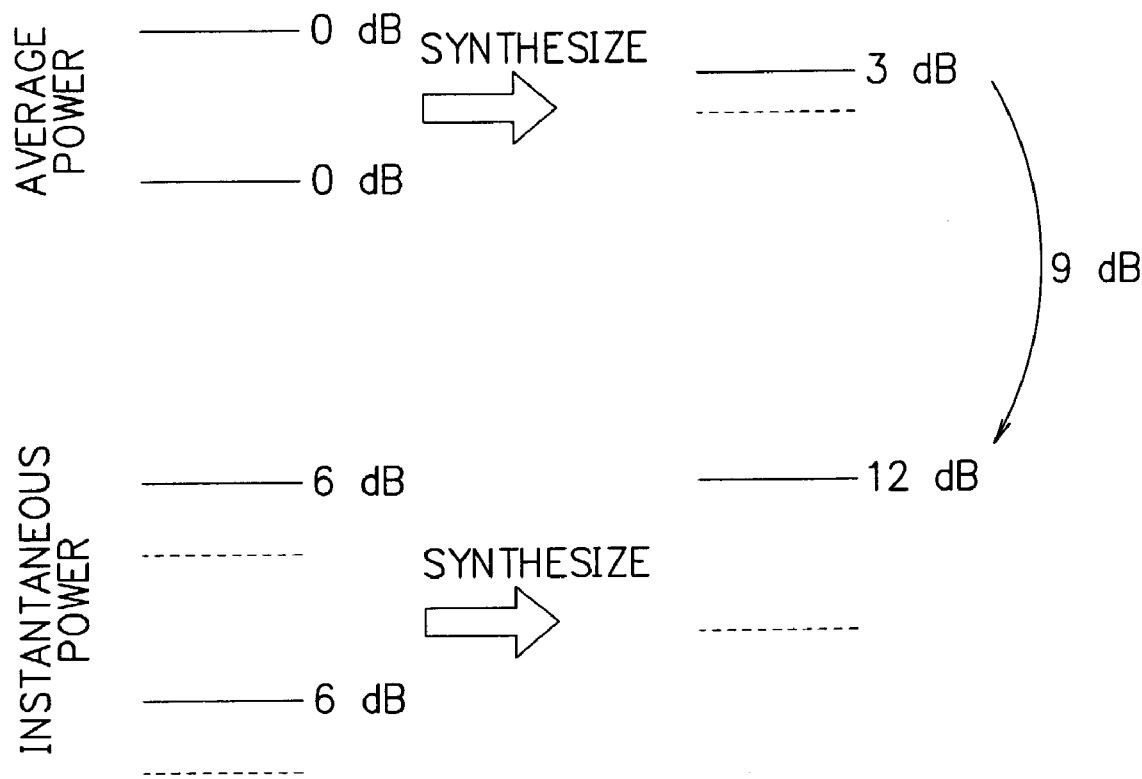
FIG. 3 is a diagram for explaining a problem in the case of applying the conventional nonlinear compensating circuit to the multicarrier amplifying method.

Referring now to the drawings, embodiments of the present invention are explained in detail.

[First Embodiment]

Figure 4:
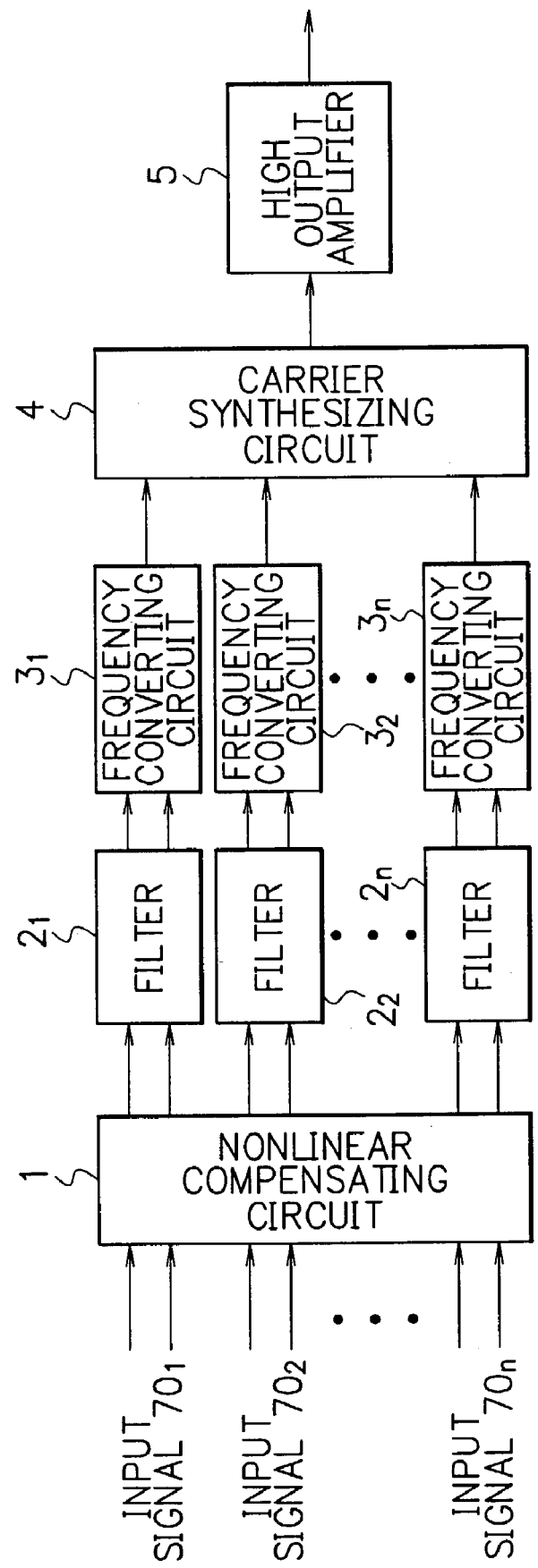
FIG. 4 is a block diagram showing a configuration of a base-station apparatus including a nonlinear compensating circuit 1 of the present invention.

FIG. 4 is a block diagram showing a configuration of a base-station apparatus using a nonlinear compensating circuit according to the first embodiment of the present invention.

The base-station apparatus according to this embodiment comprises a nonlinear compensating circuit 1, filters $2_1$ to $2_n$, frequency converting circuits $3_1$ to $3_n$, a carrier synthesizing circuit 4, and a high output amplifier 5.

According to the transmission power clipping method in this embodiment, a plurality of input signals $70_1$ to $70_n$, which are all to be amplified as a multicarrier by the amplifier 5, are clipped in consideration of a relationship between each signal, instead of clipping them independently in the state of baseband signals. To be concrete, the respective signals in the baseband area are synthesized in terms of power before inputted into the filters, and a threshold value is set for the synthesized power (synthesized signal power) to execute a clipping operation when the synthesized power exceeds the threshold value. However, it is necessary to execute signal amplitude limiting, or clipping, with respect to each signal. Consequently, a ratio between the value of the synthesized signal power and the threshold value is calculated, and the amplitude of each signal is multiplied by the square root of the ratio. Thereby, the amplitude of each signal is evenly limited, and in addition, the total power is restricted at a certain level.

In the base-station apparatus, the input signals $70_1$ to $70_n$ are input into the nonlinear compensating circuit 1 to be clipped. The clipped input signals $70_1$ to $70_n$ are filtered in the filters $2_1$ to $2_n$, respectively. The frequencies of the filtered input signals $70_1$ to $70_n$ are converted so as to be different from each other in the frequency converting circuits $3_1$ to $3_n$. Subsequently, the converted input signals $70_1$ to $70_n$ are synthesized to be a multicarrier signal in the carrier synthesizing circuit 4. Thereafter, the multicarrier signal is amplified in the high output amplifier 5.

The nonlinear compensating circuit 1 is intended to compensate the nonlinearity of the high output amplifier 5 on the occasion of transmission after performing frequency conversion of a plurality of input signals $70_1$ to $70_n$ to obtain signals of different frequencies, synthesizing the signals, and amplifying the synthesized signals by the high output amplifier 5 serving as an amplifying means.

Figure 5:
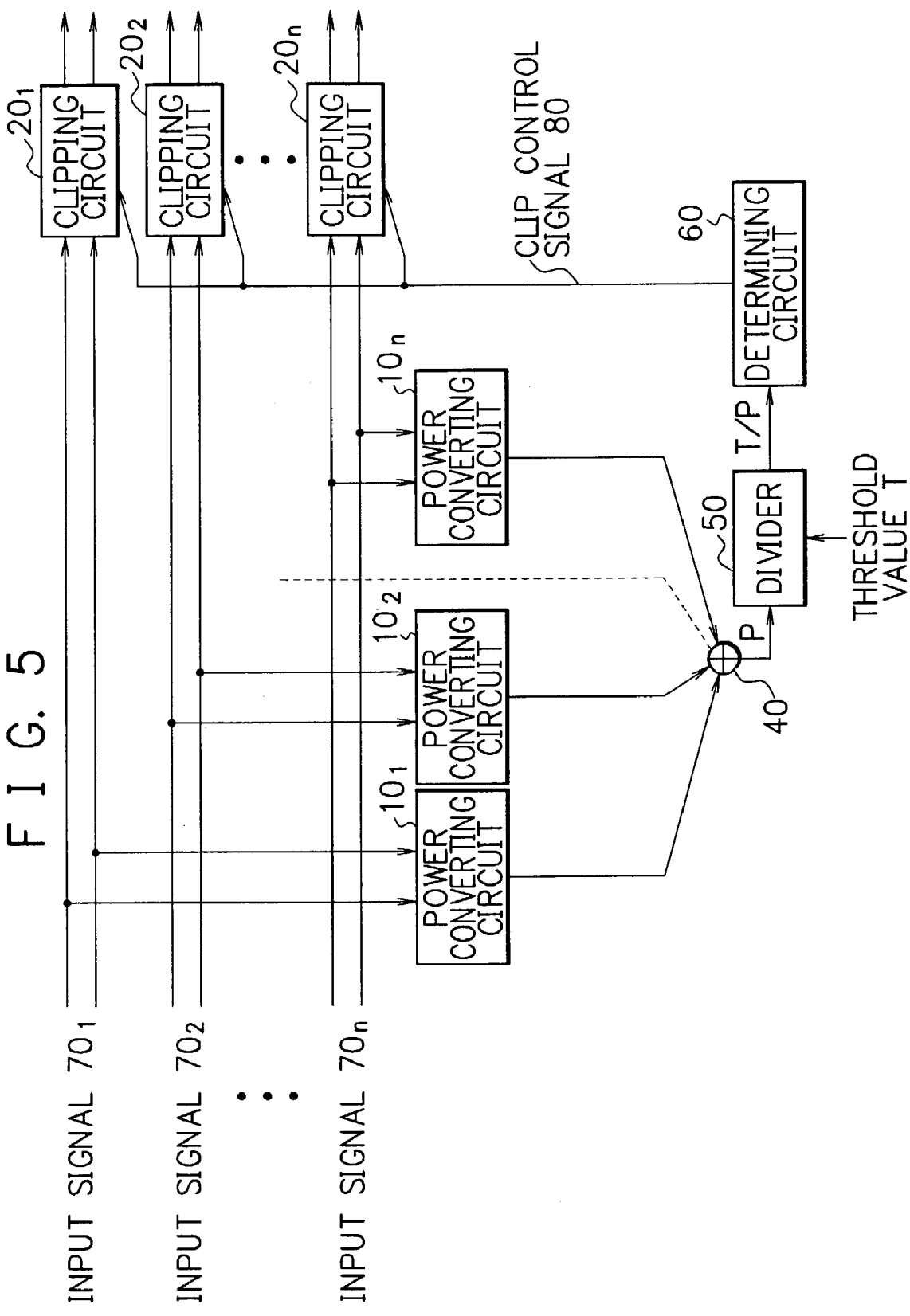
FIG. 5 is a block diagram showing a configuration of the nonlinear compensating circuit 1 according to a first embodiment of the present invention.

FIG. 5 shows a configuration of the nonlinear compensating circuit 1 depicted in FIG. 4. As shown in FIG. 5, the nonlinear compensating circuit 1 according to this embodiment comprises n pieces of power converting circuits $10_1$ to $10_n$, an adder 40, a divider 50, a determining circuit 60, and n pieces of clipping circuits $20_1$ to $20_n$.

The power converting circuits $10_1$ to $10_n$ calculate power values of the input signals $70_1$ to $70_n$, respectively. The adder 40 adds up all of the power values calculated by the power converting circuits $10_1$ to $10_n$ to obtain a synthetic power value P. The divider 50 performs an arithmetical operation of dividing a predetermined threshold value T by the synthetic power value P calculated by the adder 40, and outputs the operation result as a divided value T/P.

When the divided value T/P obtained from the divider 50 is equal to or more than 1, the determining circuit 60 outputs a clip control signal 80 for turning off the clipping operation to the clipping circuits $20_1$ to $20_n$. On the other hand, when the divided value T/P is less than 1, the determining circuit 60 outputs a clip control signal 80 for turning on the clipping operation, which includes the square root of the divided value T/P, $(T/P)^{1/2}$, to the clipping circuits $20_1$ to $20_n$.

In the above explanation, in the nonlinear compensating circuit 1 according to this embodiment, the divider 50 calculates the divided value T/P, and the determining circuit 60 determines whether or not to carry out the clipping operation on the basis of the divided value T/P. However, it is also possible to output the clip control signal 80 for turning off the clipping operation when the calculated synthetic power value P is less than or equal to the predetermined threshold value T. On the other hand, when the calculated synthetic power value P is more than the threshold value T, the clip control signal 80 for turning on the clipping operation, which includes a coefficient to make the synthetic power value P of the input signals less than or equal to the threshold value T, may be outputted.

The clipping circuits $20_1$ to $20_n$ operate according to the clip control signal 80 from the determining circuit 60. To be concrete, when receiving the clip control signal 80 for turning off the clipping operation, the clipping circuits 20₁ to 20ₙ output the input signals 70₁ to 70ₙ as they are, respectively. On the other hand, when receiving the clip control signal 80 for turning on the clipping operation, the clipping circuits 20₁ to 20ₙ multiply the input signals 70₁ to 70ₙ by the square root of the divided value T/P, $(T/P)^{1/2}$, respectively, and outputs the resultant values.

Figure 6:
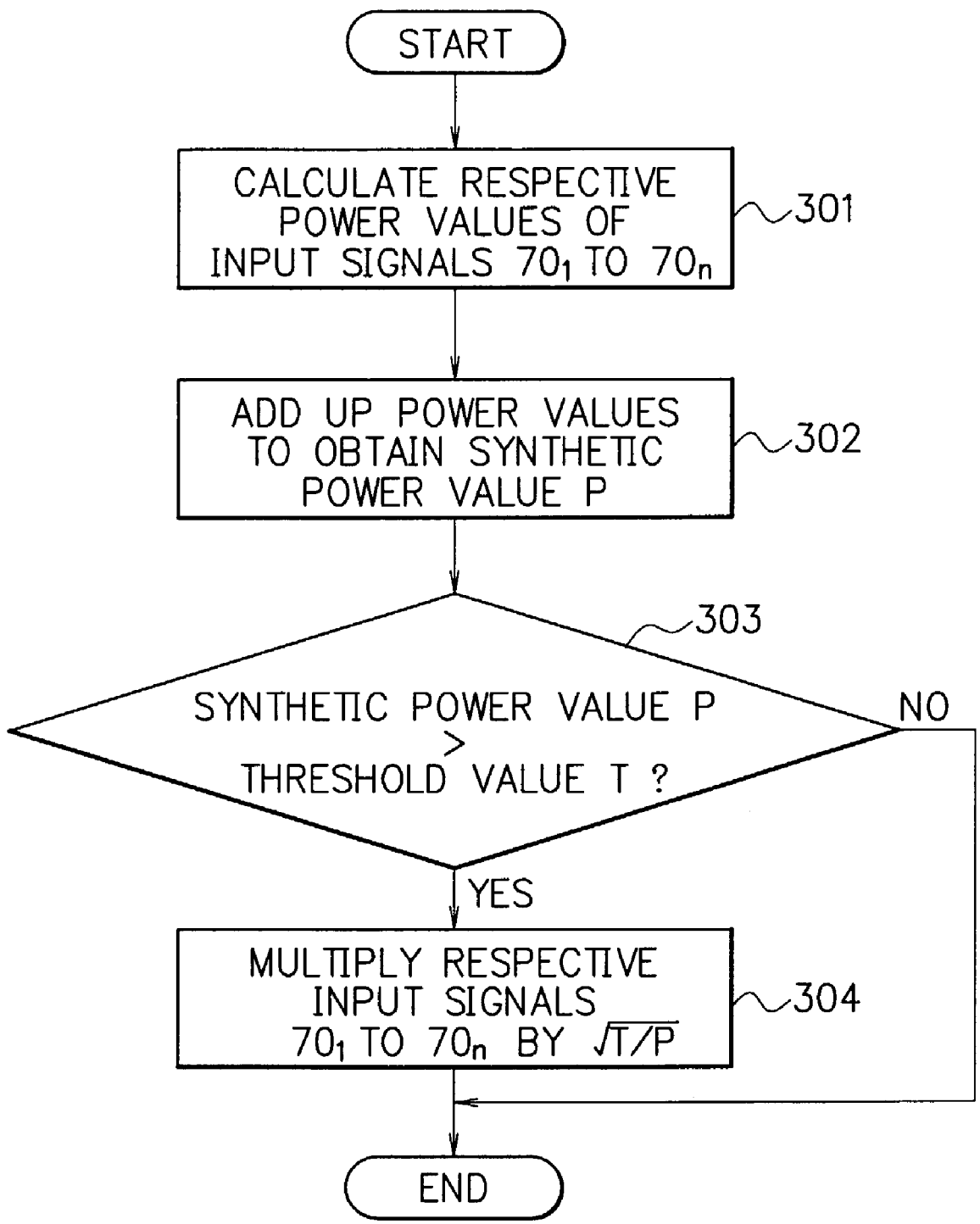
FIG. 6 is a flowchart showing the operation of a transmission power clipping method according to the first embodiment.

In the following, an explanation is given in detail of the transmission power clipping method performed in the nonlinear compensating circuit 1 according to this embodiment in reference to the flowchart in FIG. 6.

Each of the input signals 70₁ to 70ₙ in n pieces of waves (frequencies) can be expressed as a signal having bi-series; two series of In-phase and Quadrature-phase components. At this stage, the respective signals 70₁ to 70ₙ are in a chip frequency (spreading rate). In the following, the k-th input signals among respective inputs of the bi-series in each of the n waves are expressed as $P_k+jQ_k$ in terms of a complex number.

First, the input signals 70₁ to 70ₙ are input into the power converting circuit 10₁ to 10ₙ, respectively, in which the power values of the signals 70₁ to 70ₙ are calculated (Step 301). Subsequently, the n pieces of the power values calculated by the respective power converting circuits 10₁ to 10ₙ are inputted into the adder 40 to be added up, thus obtaining one value as the synthetic power value P (Step 302). The synthetic power value P is calculated by the following formula.

$$P = \sum_{k=1}^{n} (P_k^2 + Q_k^2) \quad (1)$$

Subsequently, the divider 50 divides the predetermined threshold value T by the synthetic power value P calculated by the adder 40 to output the divided value T/P as the operation result. When the divided value T/P obtained from the divider 50 is equal to or more than 1, the determining circuit 60 outputs the clip control signal 80 for turning off the clipping operation to the clipping circuits 20₁ to 20ₙ. On the other hand, when the divided value T/P is less than 1, the determining circuit 60 outputs the clip control signal 80 for turning on the clipping operation, which includes the square root of the divided value T/P, $(T/P)^{1/2}$, to the clipping circuits 20₁ to 20ₙ. That is, comparing the synthetic power value P with the threshold value T, when the synthetic power value P is larger than the threshold value T, the clipping operation is executed, and on the other hand, when the synthetic power value P is smaller than or equal to the threshold value T, the clipping operation is not executed (Step 303).

The clipping circuits 20₁ to 20ₙ operate according to the clip control signal 80 obtained from the determining circuit 60. To be concrete, when inputting therein the clip control signal 80 for turning off the clipping operation, the clipping circuits 20₁ to 20ₙ output the input signals 70₁ to 70ₙ as they are, respectively. On the other hand, when inputting therein the clip control signal 80 for turning on the clipping operation, the clipping circuits 20₁ to 20ₙ multiply the input signals 70₁ to 70ₙ by the square root of the divided value T/P, $(T/P)^{1/2}$, respectively, and output the resultant values (Step 304).

Hereat, when each of the outputs from the clipping circuits 20₁ to 2ₙ is expressed as $P_k'+jQ_k'$, the $P_k'+jQ_k'$ is represented as follows.

$$P_k' + jQ_k' = \begin{cases} (P_k + jQ_k) \times (T/P)^{\frac{1}{2}} & \text{(in the case where } T/P < 1) \\ P_k + jQ_k & \text{(in the case where } T/P \geq 1) \end{cases} \quad (2)$$

Subsequently, the signals that have undergone the clipping operation as described above are filtered with respect to each signal as shown in FIG. 4. The filtered signals are frequency-converted and synthesized into a multicarrier signal, which is amplified by the high output amplifier 5.

In the nonlinear compensating circuit according to this embodiment, the clipping operation is executed on the basis of the total power of all the carriers included in the multicarrier. Therefore, the clipping operation is performed with a value more approximate to the power (power value) after the multicarrier synthesis as compared to the conventional nonlinear compensating circuit. Thus, it becomes possible to implement the more effective clipping operation for the synthesized power and to prevent the transmission spectrum from spreading.

Figure 7:
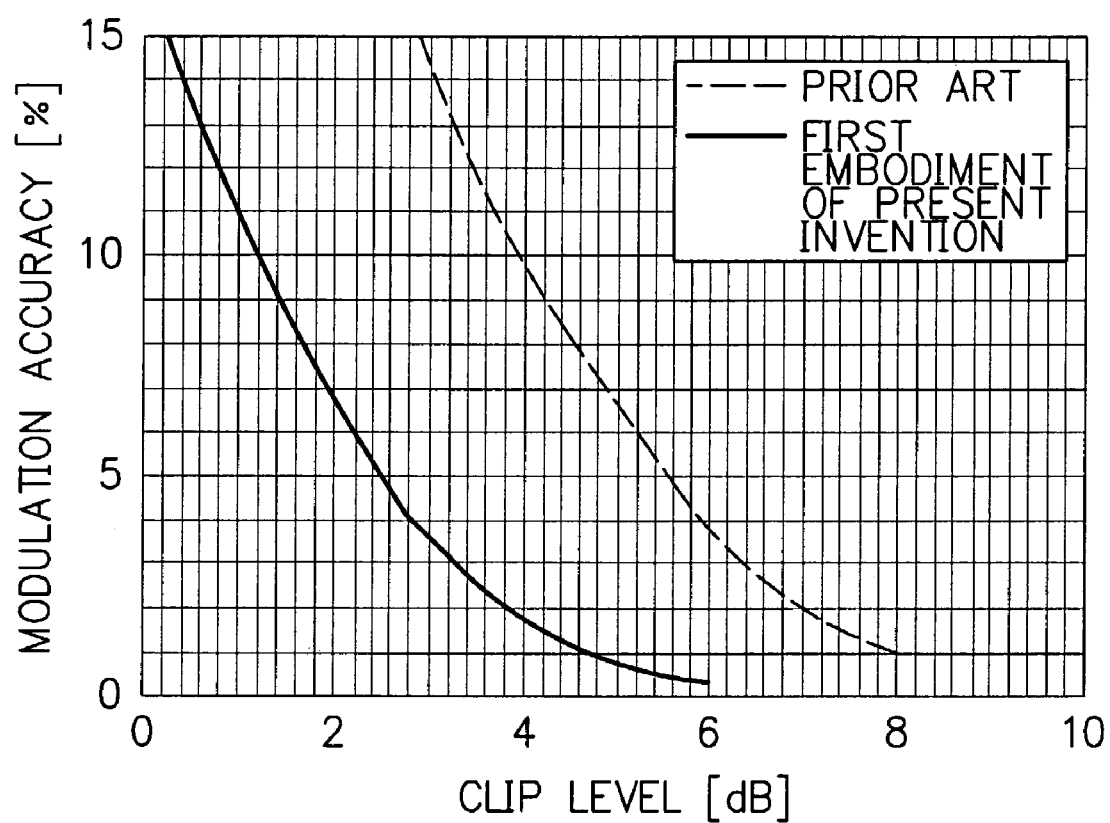
FIG. 7 is a diagram for explaining a relationship between a threshold value of clipping and modulation accuracy in the prior art and the present invention, respectively.
Figure 8:
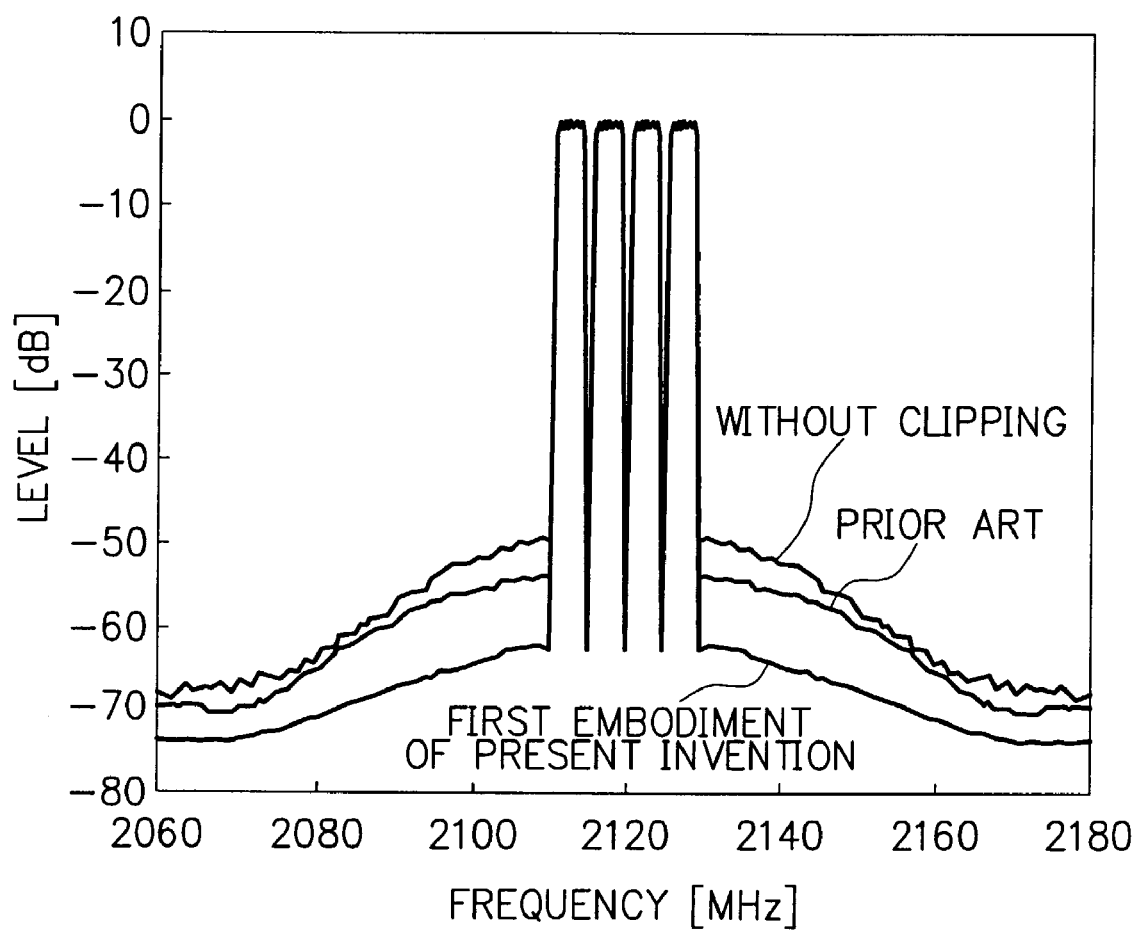
FIG. 8 is a diagram showing spectra of multicarrier signals outputted from high output amplifiers.

In the following, an explanation is given of advantages obtained by the nonlinear compensating circuit according to the first embodiment in reference to FIGS. 7 and 8. Basically, accuracy in modulating a transmission signal is deteriorated through the clipping operation. Since the relationship between the threshold value for the clipping (hereinafter referred to as "clipping threshold value") and the modulation accuracy in the first embodiment is different from that of the prior art as shown in FIG. 7 and a standard for the modulation accuracy is generally set to respective transmitters, there is a need to compare the transmission spectra at the respective clipping threshold values under the identical modulation accuracy. FIG. 8 shows the spectra under the same deterioration level of the modulation accuracy when outputting the multicarrier signals from the high power amplifiers according to the prior art and the first embodiment. As evidenced by FIG. 8, compared to the case of performing no clipping operation, the level of the edge part in the spectrum of the first embodiment is drastically improved while that of the prior art is little improved.

[Second Embodiment]

In the following, an explanation is given of a nonlinear compensating circuit according to a second embodiment of the present invention.

Figure 9:
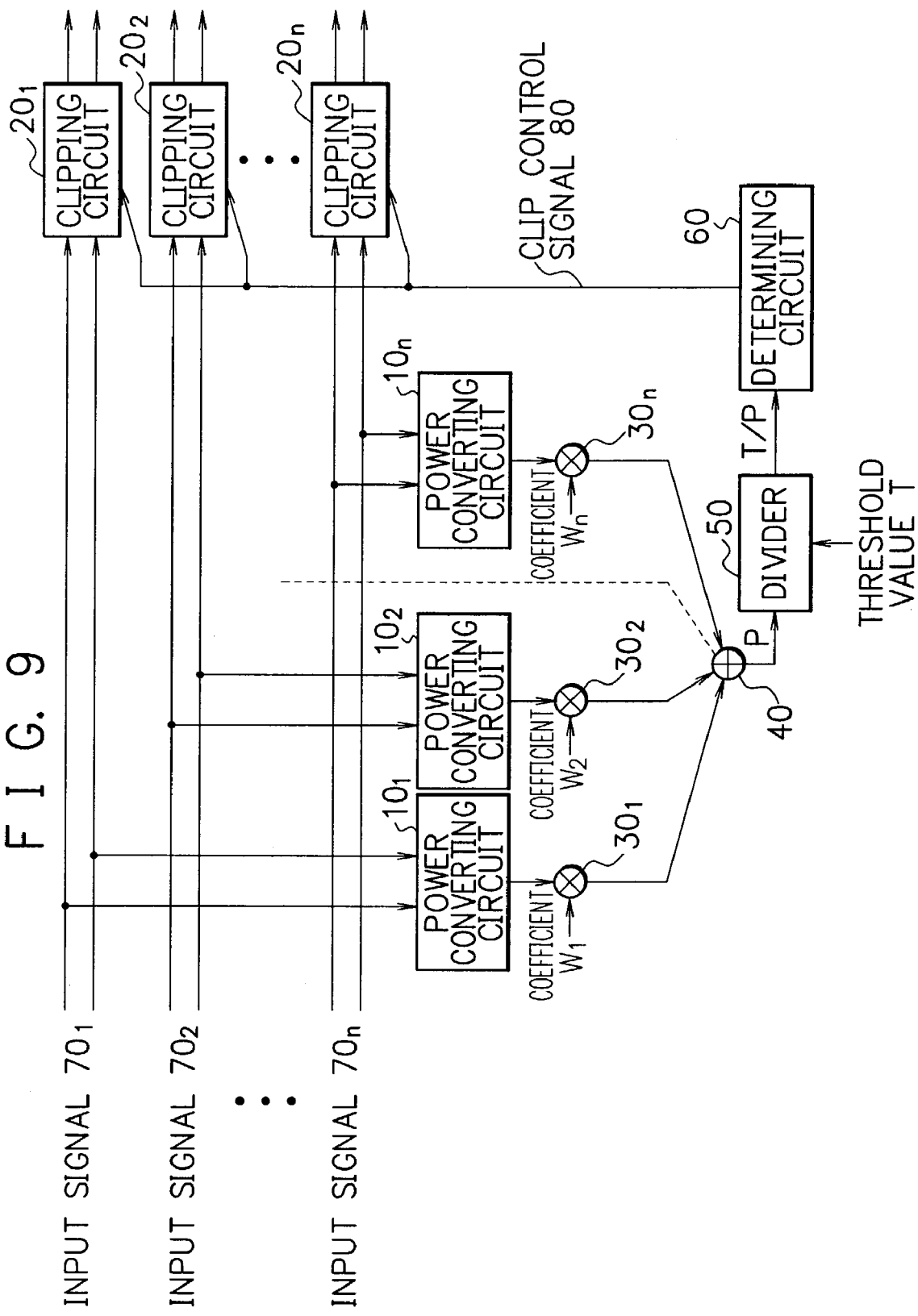
FIG. 9 is a block diagram showing a configuration of a nonlinear compensating circuit according to a second embodiment of the present invention.

FIG. 9 shows a configuration of the nonlinear compensating circuit according to this embodiment. The nonlinear compensating circuit in this embodiment has the same configuration as that in the first embodiment shown in FIG. 5 except that n pieces of multipliers 30₁ to 30ₙ are disposed between the power converting circuits 10₁ to 10ₙ and the adder 40.

The multipliers 30₁ to 30ₙ multiply the n pieces of power values calculated by the power converting circuits 10₁ to 10ₙ by coefficients $w_1$ to $w_n$, respectively, to output the resultant values. The adder 40 used in this embodiment adds up all of the outputs from the multipliers 30₁ to 30ₙ to calculate the synthetic power value P. The operation of the divider 50, determining circuit 60 and clipping circuits 20₁ to 20ₙ used in this embodiment is the same as that of the first embodiment described hereinbefore, thus abbreviating the explanation.

The synthetic power value P calculated in the nonlinear compensating circuit according to this embodiment is expressed by the following formula.

$$P = \sum_{k=1}^{n} W_k (P_k^2 + Q_k^2) \qquad (3)$$

Hereat, the coefficients $w_1$ to $w_n$ used in the multipliers $30_1$ through $30_n$ to multiply the respective power values are determined so as to counteract frequency variation in amplification characteristics (transfer characteristics) of the high output amplifier 5. By this means, according to the nonlinear compensating circuit in this embodiment, when there exists the frequency variation in the amplification characteristics of the high output amplifier 5, an ideal clipping operation can be executed by multiplying each power value by a weighting factor $w_k$ with respect to each carrier on the occasion of calculating the synthetic power of the multicarrier to absorb the frequency variation. Namely, by setting the coefficient $w_k$ so as to have inverse characteristics of the frequency characteristics of the high output amplifier 5, it becomes possible to correct and flatten the frequency characteristics of the high output amplifier 5.

[Third Embodiment]

In the following, an explanation is given of a nonlinear compensating circuit according to the third embodiment of the present invention.

FIG. 10 shows a configuration of the nonlinear compensating circuit according to the third embodiment. The nonlinear compensating circuit has the same configuration as that in the second embodiment except that the power converting circuits $10_1$ to $10_n$ are replaced by amplitude converting circuits $90_1$ to $90_n$ and the determining circuit 60 is replaced by a determining circuit 62.

The amplitude converting circuits $90_1$ to $90_n$ calculate amplitude values (square roots of power values) of the n pieces of input signals $70_1$ to $70_n$, respectively.

The multipliers $30_1$ to $30_n$ multiply the n pieces of the amplitude values calculated by the amplitude converting circuits $90_1$ to $90_n$ by coefficients $w_1$ to $w_n$ to output the resultant values, respectively. The adder 40 used in this embodiment adds up all of the outputs from the multipliers $30_1$ to $30_n$ to calculate a synthetic amplitude value A. The divider 50 carries out an operation of dividing a predetermined threshold value T' by the synthetic amplitude value A calculated by the adder 40 to output the divided value T'/A as the operation result.

The determining circuit 62 outputs a clip control signal 82 for turning off the clipping operation to the clipping circuits $20_1$ to $20_n$ when the divided value T'/A obtained from the divider 50 is equal to or more than 1. On the other hand, the determining circuit 62 outputs a clip control signal 82 for turning on the clipping operation, which includes the divided value T'/A obtained by the divider 50, to the clipping circuits $20_1$ to $20_n$ when the divided value T'/A is less than 1.

As described above, in the nonlinear compensating circuit according to the third embodiment, the divider 50 calculates the divided value T'/A and the determining circuit 62 determines whether or not to conduct the clipping operation on the basis of the divided value T'/A. However, the determining circuit 62 may output the clip control signal 82 for turning off the clipping operation when the calculated synthetic amplitude value A is less than or equal to the predetermined threshold value T'. On the other hand, the determining circuit 62 may output the clip control signal 82 for turning on the clipping operation, which includes a coefficient to make the synthetic amplitude value A less than or equal to the threshold value T', when the calculated synthetic amplitude value A is more than the predetermined threshold value T'.

Hereat, when an output from the respective clipping circuits $20_1$ to $20_n$ is expressed as $P_k''+jQ_k''$, the $P_k''+jQ_k''$ is represented as the following formula.

$$P_k'' + jQ_k'' = \begin{cases} (P_k + jQ_k) \times (T'/A) & \text{(in the case where } T'/A < 1) \\ P_k + jQ_k & \text{(in the case where } T'/A \geq 1) \end{cases} \qquad (4)$$

The nonlinear compensating circuit according to the third embodiment operates in the same manner as in the second embodiment explained hereinbefore except that the determination of whether or not to conduct the clipping operation is based on the amplitude values of the input signals $70_1$ to $70_n$. Thereby, the same advantages as in the second embodiment can be obtained. Further, while the nonlinear compensating circuit of the third embodiment is a modified form of the circuit of the second embodiment by employing the amplitude values, the similar modification can be made to the circuit of the first embodiment.

As set forth hereinbefore, according to the present invention, there is provided a clipping means that is beneficial against the nonlinear characteristics of the high output amplifier at the sending side even in the case of multicarrier amplification.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A nonlinear compensating circuit for compensating nonlinearity of an amplifying means on the occasion of transmission after performing frequency conversion of a plurality of input signals to obtain signals of different frequencies, synthesizing the signals, and amplifying the synthesized signals by the amplifying means, comprising:

a plurality of power converting means for calculating power values of the respective input signals;

an adding means for calculating a synthetic power value by adding up the power values calculated by the plural power converting means;

a determining means for determining whether or not the synthetic power value is more than a predetermined threshold value, and outputting a clip control signal for turning off a clipping operation when the calculated synthetic power value is less than or equal to the threshold value, or outputting a clip control signal for turning on a clipping operation, which includes a coefficient to make the synthetic power value of the plural input signals less than or equal to the threshold value, when the calculated synthetic power value is more than the threshold value; and a plurality of clipping means for performing clipping on/off operation according to the clip control signal obtained from the determining means, which directly output the plural input signals when inputting therein the clip control signal for turning off the clipping operation, or multiply the plural input signals by the coefficient to output the resultant values when inputting therein the clip control signal for turning on the clipping operation.

2. A base-station apparatus for executing transmission after performing frequency conversion of a plurality of input signals to obtain signals of different frequencies, synthesizing the signals, and amplifying the synthesized signals by a high output amplifier, comprising:

a nonlinear compensating circuit as claimed in claim 1;

a plurality of filters for filtering the input signals that have been clipped by the nonlinear compensating circuit, respectively;

a plurality of frequency converting means for converting the frequencies of the input signals that have been filtered by the filters so as to be different from each other, respectively;

a carrier synthesizing means for synthesizing the signals of different frequencies that have been converted by the respective frequency converting means; and an amplifying means for amplifying a multicarrier signal synthesized by the carrier synthesizing means.

3. A nonlinear compensating circuit for compensating nonlinearity of an amplifying means on the occasion of transmission after performing frequency conversion of a plurality of input signals to obtain signals of different frequencies, synthesizing the signals, and amplifying the synthesized signals by the amplifying means, comprising:

a plurality of power converting means for calculating power values of the respective input signals;

an adding means for calculating a synthetic power value P by adding up the power values calculated by the plural power converting means;

a dividing means for carrying out an operation of dividing a predetermined threshold value T by the synthetic power value P to output the operation result as a divided value T/P;

a determining means for outputting a clip control signal for turning off a clipping operation when the divided value T/P obtained from the dividing means is equal to or more than 1, or outputting a clip control signal for turning on a clipping operation, which includes a square root of the divided value, $(T/P)^{1/2}$, when the divided value T/P is less than 1; and a plurality of clipping means for performing clipping on/off operation according to the clip control signal obtained from the determining means, which directly output the plural input signals when inputting therein the clip control signal for turning off the clipping operation, or multiply the plural input signals by the square root of the divided value, $(T/P)^{1/2}$, to output the resultant values when inputting therein the clip control signal for turning on the clipping operation.

4. A nonlinear compensating circuit for compensating nonlinearity of an amplifying means on the occasion of transmission after performing frequency conversion of a plurality of input signals to obtain signals of different frequencies, synthesizing the signals, and amplifying the synthesized signals by the amplifying means, comprising:

a plurality of power converting means for calculating power values of the respective input signals;

a plurality of multiplying means for multiplying the plural power values calculated by the plural power converting means by predetermined coefficients, respectively, to output the resultant values;

an adding means for calculating a synthetic power value by adding up the outputs from the multiplying means;

a determining means for determining whether or not the synthetic power value is more than a predetermined threshold value, and outputting a clip control signal for turning off a clipping operation when the calculated synthetic power value is less than or equal to the threshold value, or outputting a clip control signal for turning on a clipping operation, which includes a coefficient to make the synthetic power value of the plural input signals less than or equal to the threshold value, when the calculated synthetic power value is more than the threshold value; and a plurality of clipping means for performing clipping on/off operation according to the clip control signal obtained from the determining means, which directly output the plural input signals when inputting therein the clip control signal for turning off the clipping operation, or multiply the plural input signals by the coefficient to output the resultant values when inputting therein the clip control signal for turning on the clipping operation.

5. A nonlinear compensating circuit for compensating nonlinearity of an amplifying means on the occasion of transmission after performing frequency conversion of a plurality of input signals to obtain signals of different frequencies, synthesizing the signals, and amplifying the synthesized signals by the amplifying means, comprising:

a plurality of power converting means for calculating power values of the respective input signals;

a plurality of multiplying means for multiplying the plural power values calculated by the plural power converting means by predetermined coefficients, respectively, to output the resultant values;

an adding means for calculating a synthetic power value P by adding up the outputs from the multiplying means;

a dividing means for carrying out an operation of dividing a predetermined threshold value T by the synthetic power value P to output the operation result as a divided value T/P;

a determining means for outputting a clip control signal for turning off a clipping operation when the divided value T/P obtained from the dividing means is equal to or more than 1, or outputting a clip control signal for turning on a clipping operation, which includes a square root of the divided value, $(T/P)^{1/2}$, when the divided value T/P is less than 1; and a plurality of clipping means for performing clipping on/off operation according to the clip control signal obtained from the determining means, which directly output the plural input signals when inputting therein the clip control signal for turning off the clipping operation, or multiply the plural input signals by the square root of the divided value, $(T/P)^{1/2}$, to output the resultant values when inputting therein the clip control signal for turning on the clipping operation.

6. A nonlinear compensating circuit for compensating nonlinearity of an amplifying means on the occasion of transmission after performing frequency conversion of a plurality of input signals to obtain signals of different frequencies, synthesizing the signals, and amplifying the synthesized signals by the amplifying means, comprising:

a plurality of amplitude converting means for calculating amplitude values of the respective input signals;

an adding means for calculating a synthetic amplitude value by adding up the amplitude values calculated by the plural amplitude converting means;

a determining means for determining whether or not the synthetic amplitude value is more than a predetermined threshold value, and outputting a clip control signal for turning off a clipping operation when the calculated synthetic amplitude value is less than or equal to the threshold value, or outputting a clip control signal for turning on a clipping operation, which includes a coefficient to make the synthetic amplitude value of the plural input signals less than or equal to the threshold value, when the calculated synthetic amplitude value is more than the threshold value; and a plurality of clipping means for performing clipping on/off operation according to the clip control signal obtained from the determining means, which directly output the plural input signals when inputting therein the clip control signal for turning off the clipping operation, or multiply the plural input signals by the coefficient to output the resultant values when inputting therein the clip control signal for turning on the clipping operation.

7. A nonlinear compensating circuit for compensating nonlinearity of an amplifying means on the occasion of transmission after performing frequency conversion of a plurality of input signals to obtain signals of different frequencies, synthesizing the signals, and amplifying the synthesized signals by the amplifying means, comprising:

a plurality of amplitude converting means for calculating amplitude values of the respective input signals;

an adding means for calculating a synthetic amplitude value A by adding up the amplitude values calculated by the plural amplitude converting means;

a dividing means for carrying out an operation of dividing a predetermined threshold value T' by the synthetic amplitude value A to output the operation result as a divided value T'/A;

a determining means for outputting a clip control signal for turning off a clipping operation when the divided value T'/A obtained from the dividing means is equal to or more than 1, or outputting a clip control signal for turning on a clipping operation, which includes the divided value T'/A, when the divided value T'/A is less than 1; and a plurality of clipping means for performing clipping on/off operation according to the clip control signal obtained from the determining means, which directly output the plural input signals when inputting therein the clip control signal for turning off the clipping operation, or multiply the plural input signals by the divided value T'/A to output the resultant values when inputting therein the clip control signal for turning on the clipping operation.

8. A nonlinear compensating circuit for compensating nonlinearity of an amplifying means on the occasion of transmission after performing frequency conversion of a plurality of input signals to obtain signals of different frequencies, synthesizing the signals, and amplifying the synthesized signals by the amplifying means, comprising:

a plurality of amplitude converting means for calculating amplitude values of the respective input signals;

a plurality of multiplying means for multiplying the plural amplitude values calculated by the plural amplitude converting means by predetermined coefficients, respectively, to output the resultant values;

an adding means for calculating a synthetic amplitude value by adding up the outputs from the multiplying means;

a determining means for determining whether or not the synthetic amplitude value is more than a predetermined threshold value, and outputting a clip control signal for turning off a clipping operation when the calculated synthetic amplitude value is less than or equal to the threshold value, or outputting a clip control signal for turning on a clipping operation, which includes a coefficient to make the synthetic amplitude value of the plural input signals less than or equal to the threshold value, when the calculated synthetic amplitude value is more than the threshold value; and a plurality of clipping means for performing clipping on/off operation according to the clip control signal obtained from the determining means, which directly output the plural input signals when inputting therein the clip control signal for turning off the clipping operation, or multiply the plural input signals by the coefficient to output the resultant values when inputting therein the clip control signal for turning on the clipping operation.

9. A nonlinear compensating circuit for compensating nonlinearity of an amplifying means on the occasion of transmission after performing frequency conversion of a plurality of input signals to obtain signals of different frequencies, synthesizing the signals, and amplifying the synthesized signals by the amplifying means, comprising:

a plurality of amplitude converting means for calculating amplitude values of the respective input signals;

a plurality of multiplying means for multiplying the plural amplitude values calculated by the plural amplitude converting means by predetermined coefficients, respectively, to output the resultant values;

an adding means for calculating a synthetic amplitude value A by adding up the outputs from the multiplying means;

a dividing means for carrying out an operation of dividing a predetermined threshold value T' by the synthetic amplitude value A to output the operation result as a divided value T'/A;

a determining means for outputting a clip control signal for turning off a clipping operation when the divided value T'/A obtained from the dividing means is equal to or more than 1, or outputting a clip control signal for turning on a clipping operation, which includes the divided value T'/A, when the divided value T'/A is less than 1; and a plurality of clipping means for performing clipping on/off operation according to the clip control signal obtained from the determining means, which directly output the plural input signals when inputting therein the clip control signal for turning off the clipping operation, or multiply the plural input signals by the divided value T'/A to output the resultant values when inputting therein the clip control signal for turning on the clipping operation.

10. A transmission power clipping method for compensating nonlinearity of an amplifying means on the occasion of transmission after performing frequency conversion of a plurality of input signals to obtain signals of different frequencies, synthesizing the signals, and amplifying the synthesized signals by the amplifying means, comprising the steps of:

calculating power values of the respective input signals;

calculating a synthetic power value by adding up the calculated power values;

comparing the synthetic power value with a predetermined threshold value; and directly outputting the plural input signals without clipping when the synthetic power value is less than or equal to the threshold value, or clipping the plural input signals by multiplying the plural input signals by a coefficient to make the synthetic power value of the plural input signals less than or equal to the threshold value to output the resultant values when the synthetic power value is more than the threshold value.

11. A transmission power clipping method for compensating nonlinearity of an amplifying means on the occasion of transmission after performing frequency conversion of a plurality of input signals to obtain signals of different frequencies, synthesizing the signals, and amplifying the synthesized signals by the amplifying means, comprising the steps of:

calculating power values of the respective input signals;

calculating a synthetic power value P by adding up the calculated power values;

comparing the synthetic power value P with a predetermined threshold value T; and directly outputting the plural input signals without clipping when the synthetic power value P is less than or equal to the threshold value T, or clipping the plural input signals by multiplying the plural input signals by a square root of a divided value obtained by dividing the threshold value T by the synthetic power value P, $(T/P)^{1/2}$, to output the resultant values when the synthetic power value P is more than the threshold value T.

12. A transmission power clipping method for compensating nonlinearity of an amplifying means on the occasion of transmission after performing frequency conversion of a plurality of input signals to obtain signals of different frequencies, synthesizing the signals, and amplifying the synthesized signals by the amplifying means, comprising the steps of:

calculating power values of the respective input signals;

multiplying the calculated power values by predetermined coefficients, respectively, to output the resultant values;

calculating a synthetic power value by adding up the power values multiplied by the predetermined coefficients;

comparing the synthetic power value with a predetermined threshold value; and directly outputting the plural input signals without clipping when the synthetic power value is less than or equal to the threshold value, or clipping the plural input signals by multiplying the plural input signals by a coefficient to make the synthetic power value of the plural input signals less than or equal to the threshold value to output the resultant values when the synthetic power value is more than the threshold value.

13. A transmission power clipping method for compensating nonlinearity of an amplifying means on the occasion of transmission after performing frequency conversion of a plurality of input signals to obtain signals of different frequencies, synthesizing the signals, and amplifying the synthesized signals by the amplifying means, comprising the steps of:

calculating power values of the respective input signals;

multiplying the calculated power values by predetermined coefficients, respectively, to output the resultant values;

calculating a synthetic power value P by adding up the power values multiplied by the predetermined coefficients;

comparing the synthetic power value P with a predetermined threshold value T; and directly outputting the plural input signals without clipping when the synthetic power value P is less than or equal to the threshold value T, or clipping the plural input signals by multiplying the plural input signals by a square root of a divided value obtained by dividing the threshold value T by the synthetic power value P, $(T/P)^{1/2}$, to output the resultant values when the synthetic power value P is more than the threshold value T.

14. A transmission power clipping method for compensating nonlinearity of an amplifying means on the occasion of transmission after performing frequency conversion of a plurality of input signals to obtain signals of different frequencies, synthesizing the signals, and amplifying the synthesized signals by the amplifying means, comprising the steps of:

calculating amplitude values of the respective input signals;

calculating a synthetic amplitude value by adding up the calculated amplitude values;

comparing the synthetic amplitude value with a predetermined threshold value; and directly outputting the plural input signals without clipping when the synthetic amplitude value is less than or equal to the threshold value, or clipping the plural input signals by multiplying the plural input signals by a coefficient to make the synthetic amplitude value of the plural input signals less than or equal to the threshold value to output the resultant values when the synthetic amplitude value is more than the threshold value.

15. A transmission power clipping method for compensating nonlinearity of an amplifying means on the occasion of transmission after performing frequency conversion of a plurality of input signals to obtain signals of different frequencies, synthesizing the signals, and amplifying the synthesized signals by the amplifying means, comprising the steps of:

calculating amplitude values of the respective input signals;

calculating a synthetic amplitude value A by adding up the calculated amplitude values;

comparing the synthetic amplitude value A with a predetermined threshold value T'; and directly outputting the plural input signals without clipping when the synthetic amplitude value A is less than or equal to the threshold value T', or clipping the plural input signals by multiplying the plural input signals by a divided value obtained by dividing the threshold value T' by the synthetic amplitude value A, T'/A, to output the resultant values when the synthetic amplitude value A is more than the threshold value T'.

16. A transmission power clipping method for compensating nonlinearity of an amplifying means on the occasion of transmission after performing frequency conversion of a plurality of input signals to obtain signals of different frequencies, synthesizing the signals, and amplifying the synthesized signals by the amplifying means, comprising the steps of:

calculating amplitude values of the respective input signals;

multiplying the calculated plural amplitude values by predetermined coefficients, respectively, to output the resultant values;

calculating a synthetic amplitude value by adding up the amplitude values multiplied by the predetermined coefficients;

comparing the synthetic amplitude value with a predetermined threshold value; and directly outputting the plural input signals without clipping when the synthetic amplitude value is less than or equal to the threshold value, or clipping the plural input signals by multiplying the plural input signals by a coefficient to make the synthetic amplitude value of the plural input signals less than or equal to the threshold value to output the resultant values when the synthetic amplitude value is more than the threshold value.

17. A transmission power clipping method for compensating nonlinearity of an amplifying means on the occasion of transmission after performing frequency conversion of a plurality of input signals to obtain signals of different frequencies, synthesizing the signals, and amplifying the synthesized signals by the amplifying means, comprising the steps of:

calculating amplitude values of the respective input signals;

multiplying the calculated amplitude values by predetermined coefficients, respectively, to output the resultant values;

calculating a synthetic amplitude value A by adding up the amplitude values multiplied by the predetermined coefficients;

comparing the synthetic amplitude value A with a predetermined threshold value T'; and directly outputting the plural input signals without clipping when the synthetic amplitude value A is less than or equal to the threshold value T', or clipping the plural input signals by multiplying the plural input signals by a divided value obtained by dividing the threshold value T' by the synthetic amplitude value A, T'/A, to output the resultant values when the synthetic amplitude value A is more than the threshold value T'.

* * * * *